(12) United States Patent
Hofacker et al.

(10) Patent No.: US 12,607,691 B1
(45) Date of Patent: Apr. 21, 2026

(54) SYSTEMS AND METHODS FOR DOWNHOLE RESISTANCE MEASUREMENTS

(71) Applicant: Schlumberger Technology Corporation, Sugar Land, TX (US)

(72) Inventors: Mark Hofacker, Sugar Land, TX (US); Jordi Juan Segura Dominguez, Richmond, TX (US); Carlos Urdaneta, Houston, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

(21) Appl. No.: 19/195,609

(22) Filed: Apr. 30, 2025

(51) Int. Cl.
    *G01R 31/59* (2020.01)
    *E21B 47/135* (2012.01)

(52) U.S. Cl.
    CPC ............ *G01R 31/59* (2020.01); *E21B 47/135* (2020.05)

(58) Field of Classification Search
    CPC .............................. G01R 31/59; E21B 47/135
    See application file for complete search history.

(56) References Cited

U.S. PATENT DOCUMENTS

| | | | | | |
|---|---|---|---|---|---|
| 3,890,567 | A | * | 6/1975 | Knufflmann | G01R 31/59 |
| | | | | | 324/715 |
| 7,597,142 | B2 | * | 10/2009 | Hartog | E21B 47/01 |
| | | | | | 166/250.01 |
| 8,269,647 | B2 | * | 9/2012 | Solis | E21B 47/04 |
| | | | | | 324/519 |
| 10,947,837 | B2 | * | 3/2021 | Jarvis | E21B 47/13 |
| 2020/0400508 | A1 | * | 12/2020 | Hashemian | G01K 1/14 |
| 2021/0350953 | A1 | * | 11/2021 | Nicolas | E21B 17/003 |

* cited by examiner

*Primary Examiner* — John E Breene
*Assistant Examiner* — Janice M Soto
(74) *Attorney, Agent, or Firm* — Jeffrey D. Frantz

(57) ABSTRACT

A system may convey a conveyance line including an electrical cable in a downhole environment. A system may measure a distributed electrical resistance of the electrical cable. A system may select a first point of the electrical cable. A system may, based on a first electrical resistance at the first point and a known initial electrical resistance, determine a first cable temperature of the electrical cable at the first point.

11 Claims, 8 Drawing Sheets

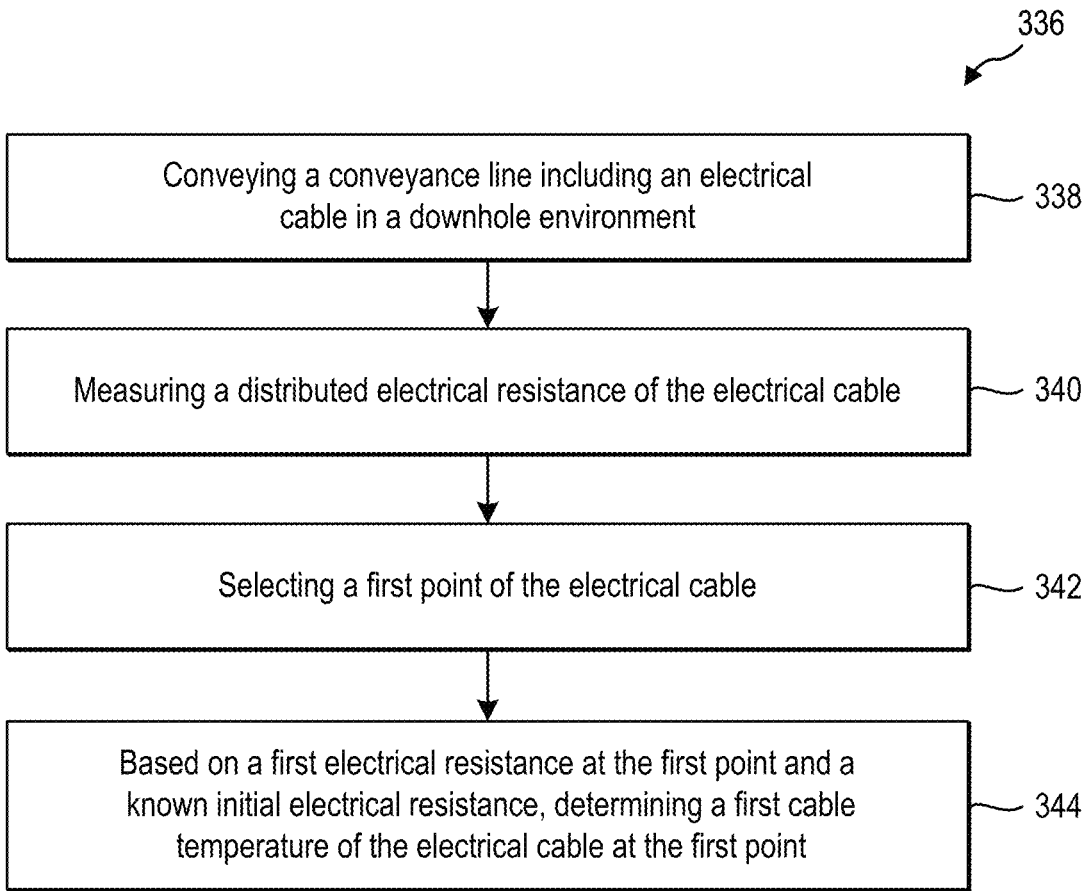

336

| | |
|---|---|
| Conveying a conveyance line including an electrical cable in a downhole environment | 338 |
| Measuring a distributed electrical resistance of the electrical cable | 340 |
| Selecting a first point of the electrical cable | 342 |
| Based on a first electrical resistance at the first point and a known initial electrical resistance, determining a first cable temperature of the electrical cable at the first point | 344 |

FIG. 3

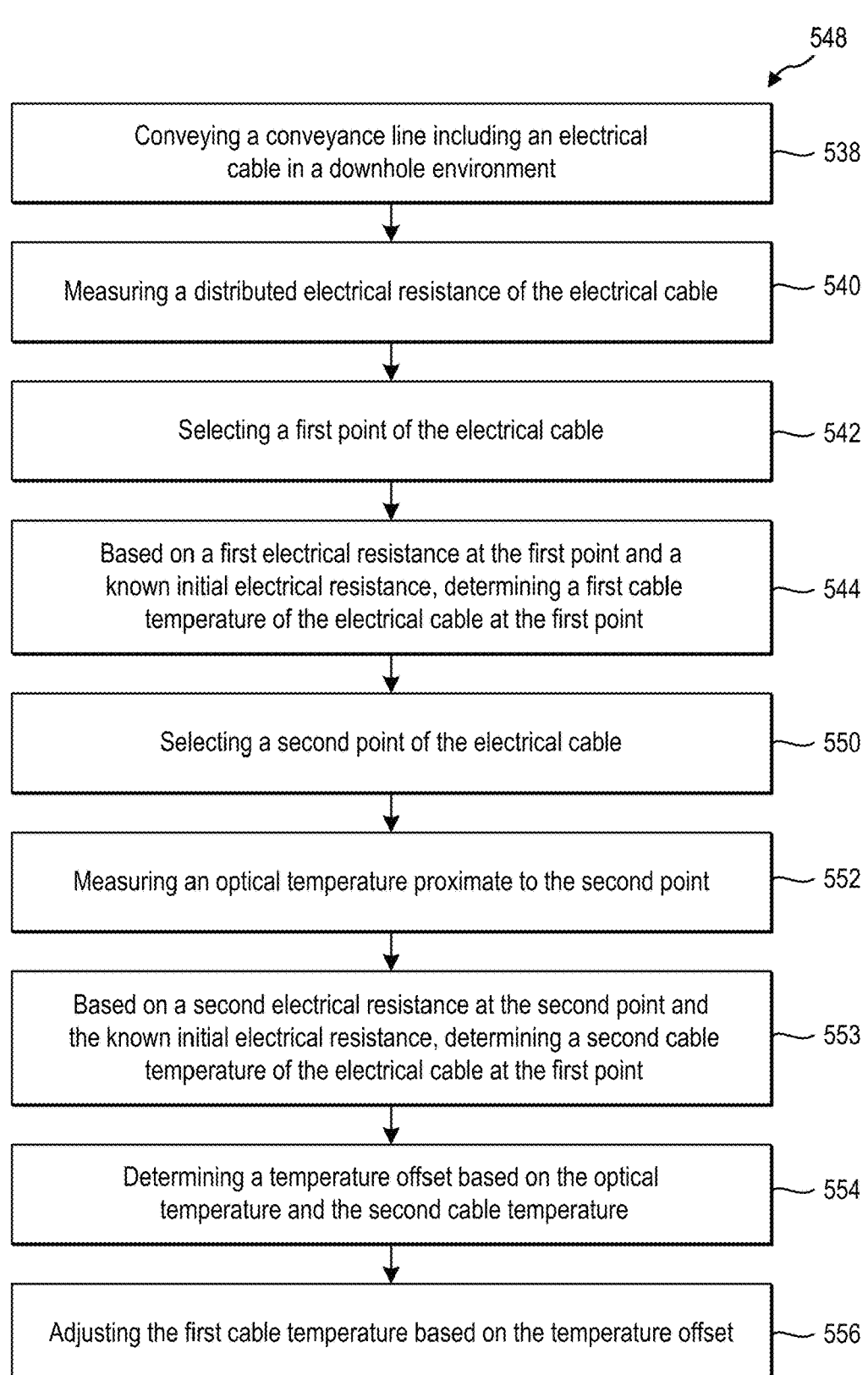

548

Conveying a conveyance line including an electrical cable in a downhole environment — 538

Measuring a distributed electrical resistance of the electrical cable — 540

Selecting a first point of the electrical cable — 542

Based on a first electrical resistance at the first point and a known initial electrical resistance, determining a first cable temperature of the electrical cable at the first point — 544

Selecting a second point of the electrical cable — 550

Measuring an optical temperature proximate to the second point — 552

Based on a second electrical resistance at the second point and the known initial electrical resistance, determining a second cable temperature of the electrical cable at the first point — 553

Determining a temperature offset based on the optical temperature and the second cable temperature — 554

Adjusting the first cable temperature based on the temperature offset — 556

FIG. 5

SYSTEMS AND METHODS FOR DOWNHOLE RESISTANCE MEASUREMENTS

BACKGROUND OF THE DISCLOSURE

Exploring, drilling, and completing hydrocarbon and other wells are generally complicated, time consuming and ultimately very expensive endeavors. As such, tremendous emphasis is often placed on well applications and monitoring that rely heavily on periodic intervention for sake of well management. For example, various wireline (WL), tractoring, coiled tubing (CT) and other types of interventions are often periodically introduced to the well throughout the life of the well. These interventions may be aimed at acquiring well condition information, directing a well cleanout, installation of downhole devices or a variety of other applications.

SUMMARY

In some aspects, the techniques described herein relate to a method of measuring temperature in a downhole environment, the method including: conveying a conveyance line including an electrical cable in a downhole environment; measuring a distributed electrical resistance of the electrical cable; selecting a first point of the electrical cable; and based on a first electrical resistance at the first point and a known initial electrical resistance, determining a first cable temperature of the electrical cable at the first point.

In some aspects, the techniques described herein relate to a method of conveying a downhole tool in a downhole environment, the method including: conveying an conveyance line including an electrical cable and coiled tube line in a downhole environment; measuring an electrical resistance of the electrical cable; measuring a temperature of the electrical cable; and based on the electrical resistance and a known initial electrical resistance, determining a strain applied to the electrical cable.

In some aspects, the techniques described herein relate to a system, including: a derrick; a conveyance line positioned within a wellbore and being conveyed from a drum, wherein the conveyance line includes an electrical cable; and a reflectometer in electrical communication with the electrical cable.

This summary is provided to introduce a selection of concepts that are further described in the detailed description. This summary is not intended to identify key or essential features of the claimed subject matter, nor is it intended to be used as an aid in limiting the scope of the claimed subject matter. Additional features and aspects of embodiments of the disclosure will be set forth herein, and in part will be obvious from the description, or may be learned by the practice of such embodiments.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 2-1 and FIG. 2-2 illustrate an embodiment of time domain reflectometry.

FIG. 3 is a flowchart illustrating a method of measuring temperature in downhole environment, according to at least one embodiment of the present disclosure.

FIG. 5 is a flowchart illustrating a method of measuring a downhole property using a hybrid cable, according to at least some embodiments of the present disclosure.

DETAILED DESCRIPTION

Figure 1:
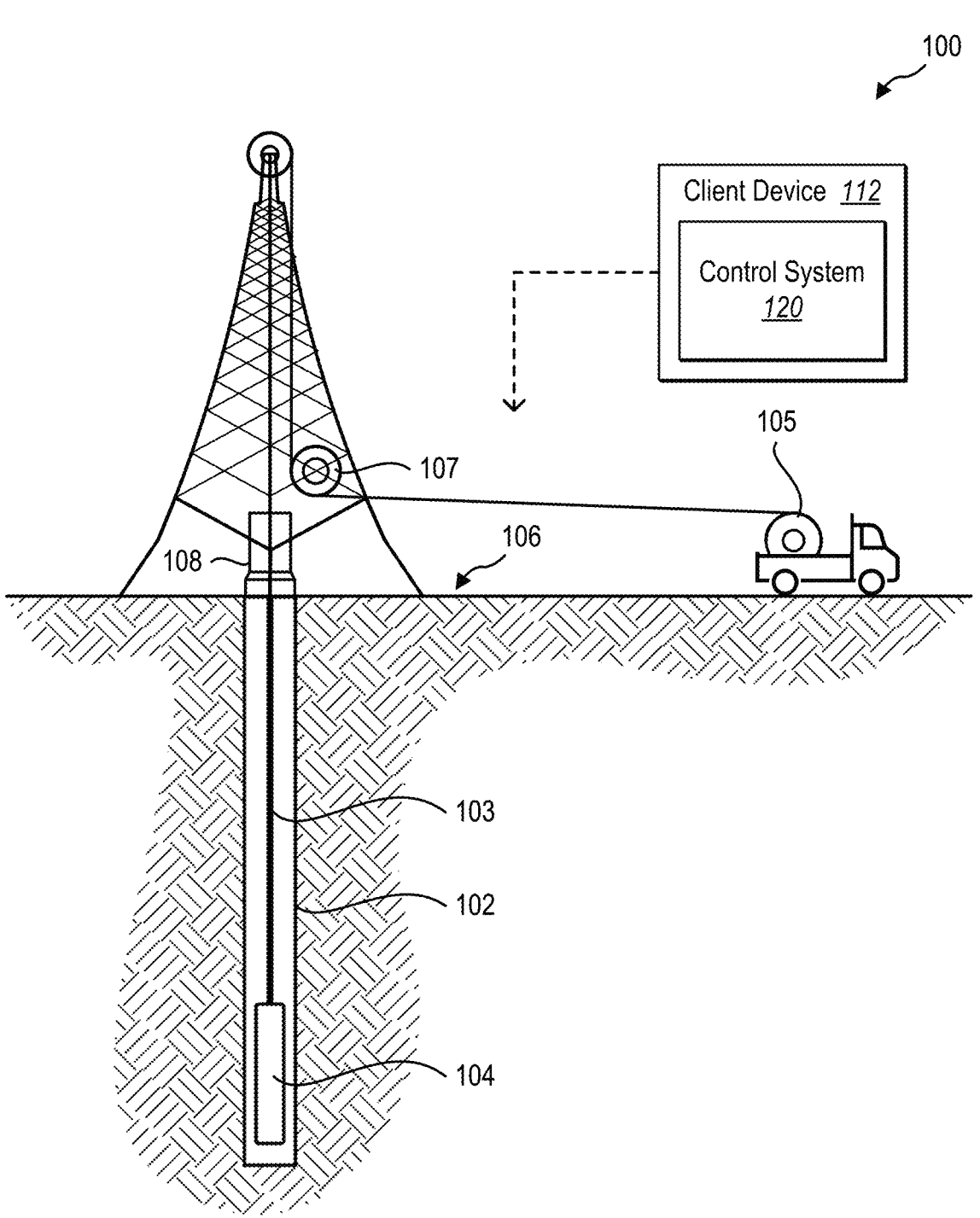
FIG. 1 is an example of a conveyance system, according to at least one embodiment of the present disclosure.

This disclosure generally relates to systems and methods for measurements in a downhole environment. More particularly, the present disclosure relates to measuring one or more conditions of a wireline (WL) and/or coiled tubing (CT) system. In some embodiments, Additional details will now be provided regarding systems described herein in relation to illustrative figures portraying example implementations. For example, FIG. 1 shows one example of a conveyance system 100 for performing a conveyance operation within a wellbore 102. The conveyance system 100 includes a rig, mast, or derrick 101 used to support a conveyance line 103 (e.g., WL line or CT line) at a surface 106. The conveyance line 103 may be suspended, inserted into, or otherwise positioned within the wellbore 102. For instance, the conveyance line 103 may pass through a wellhead 108. The wellhead 108 may provide a structural, pressure, and/or fluid barrier between the wellbore and the surface 106. For instance, the wellhead 108 may contain wellbore fluids within the wellbore 102. In some embodiments, surface equipment of the conveyance system 100 includes an injector head for conveying the conveyance line 103 within the wellbore. For example, an injector head may include one or more (e.g., hydraulic) drives, chain assemblies, grip assemblies, or other components for providing a tractive effort for running and/or retrieving the conveyance line 103 into and/or from the wellbore 102.

The wellbore 102 may extend through a subsurface and may traverse various formations, layers, strata, or other subterranean features. The wellbore 102 may be a completed (e.g., fully drilled or fully formed) wellbore, or may be a wellbore at any intermediate stage of completion and/or drilling. The wellbore 102 is depicted as extending substantially straight or vertical into the ground, however, the wellbore 102 may be formed in accordance with any trajectory. For example, the wellbore 102 can include one or more bends, doglegs, inclinations, etc., such that the wellbore 102 may exhibit any level of deviation or tortuosity, including in 3-dimensional space.

The conveyance line 103 is connected to a downhole tool 104 for supporting or positioning the downhole tool 104 in the wellbore 102. The downhole tool 104 may be a logging tool, a completion tool, a production tool, or any other tool used for performing any downhole operation, such as for imaging or otherwise measuring characteristics of the wellbore 102 or subsurface, performing a perforation, setting a plug, retrieving lost or stuck equipment, isolating wellbore sections, testing wellbore integrity, sampling fluids, wellbore cleaning, wellbore repair, opening or closing valves, stimulation (e.g., fracking), circulating fluid, downhole communication, or any other tool for performing any other downhole function.

The conveyance line 103 is contained on a spool, reel, or drum 105 which is typically mounted to a truck, trailer, skid, or other equipment. The conveyance line 103 and the downhole tool 104 are advanced into and out of the wellbore 102 from the drum 105 through a series of pulleys, sheaves, motors, and drives. For example, the derrick 101 may include one or more sheaves 107 for directing the conveyance line 103 from the drum into the wellbore 102. The derrick 101 may represent an integration of the conveyance system 100 with an existing drill rig (e.g., used for forming the wellbore) or may be implemented as a separate derrick, mast, rig or other surface equipment constructed for administering the conveyance line 103 into the wellbore.

The conveyance line 103, the downhole tool 104, and other components of the conveyance system 100 may be subject to various forces, loads, and other dynamics. These various components have failure limits and other operational thresholds at which the components may break, yield, or otherwise fail. In at least some embodiments, the conveyance system 100 is controlled to limit strain on the conveyance line 103 to below a failure point.

The conveyance system 100 may include or may be associated with a client device 112 with a conveyance control system 120 implemented thereon (e.g., or with a client application implemented thereon for accessing the conveyance control system 120 as described herein). The conveyance control system 120 may facilitate identifying working thresholds for conveying the conveyance line 103 within the wellbore 102, as well as operating the conveyance control system 120 within those thresholds.

Figures 1, 2:
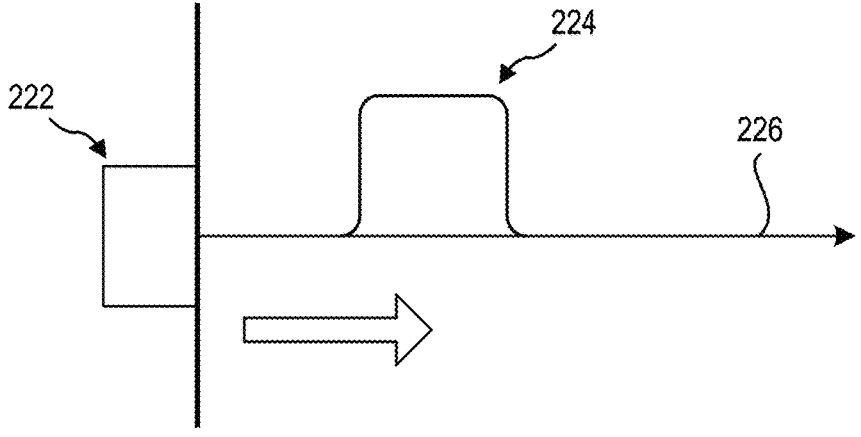
Figure 2:
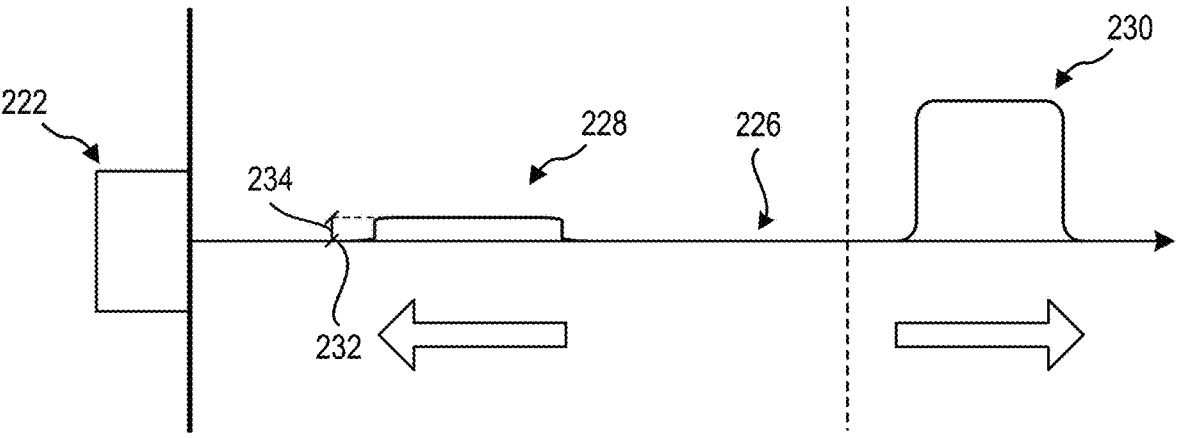

FIG. 2-1 and FIG. 2-2 illustrate an example of time domain reflectometry. A time domain reflectometer (TDR) measures reflected electrical pulses. In some embodiments, the TDR 222 provides an input pulse 224 to a transmission medium 226. For example, the TDR may provide an electrical input pulse to an electrically conductive material, such as an electrical cable. In other examples, the TDR provides an optical pulse to an optically transmissive optical cable, such as a fiber optic cable or bundle. The input pulse propagates through the transmission medium 226 away from the TDR 222 until a variation in the transmissive medium 226 reflects at least a portion of the input pulse 224 as a reflected pulse 228. In some embodiments, at least a second portion of the input pulse 224 continues through the transmissive medium 226 past the variation as a transmitted pulse 230. It should be understood that, while the input pulse 224, reflected pulse 228, and transmitted pulse 230 are referred to as "pulses", the input, reflected, and/or transmitted signals may have a longer duration, such as a plurality of wave periods, in the signal(s). In some embodiments, an input pulse is at least 25 picoseconds (ps) in duration. In some embodiments, an input pulse is at least 100 picoseconds (ps) in duration. In some embodiments, an input pulse is at least 250 picoseconds (ps) in duration. In some embodiments, the input pulse is no more than 10 milliseconds (ms) in duration. In some embodiments, the input pulse has a rise time of less than 100 picoseconds. In some embodiments, the input pulse has a rise time of less than 50 picoseconds. In some embodiments, the input pulse has a rise time of less than 25 picoseconds.

In some embodiments, the TDR 222 measures one or more properties of the reflected pulse 228 to measure or more characteristics of the transmissive medium 226. For example, the TDR 222 may measure an elapsed time between providing the input pulse 224 and receiving the reflected pulse 228. In some examples, the TDR 222 measures the leading edge 232 of the reflected pulse 228. For example, the TDR 222 may measure the elapsed time at which the leading edge 232 is received. In other examples, the TDR 222 may measure a height 234 of the leading edge 232. In some examples, the TDR 222 measures a rise time of the leading edge 232.

Changes in resistivity (or transmissivity) of the transmissive medium 226, such as due to discontinuities 229 or breaks, cause reflected pulses 228. In some embodiments, the reflected pulse 228 is generated by a break in an electrical cable, reflecting back the pulse with little loss or change to the pulse. In some embodiments, the reflected pulse 228 is generated by an increase in resistivity of the transmissive medium. For example, resistivity of an electrical cable increases with increasing temperature. Therefore, changes in temperature can occur in the wellbore, such as at different formation layers or due to operational processes, such as acid treatments, performed in the wellbore and/or surrounding formation. In such examples, one or more measured properties of the reflected pulse 228 indicate a change in temperature of the electrical cable, and an elapsed time between the input pulse and the reflected pulse indicates a distance of the change in temperature.

In other examples, resistivity of an electrical cable increases with strain experienced by the electrical cable. In such examples, one or more measured properties of the reflected pulse 228 indicate a strain of the electrical cable, and an elapsed time between the input pulse and the reflected pulse indicates a distance of the strain. Such measurements can inform a control system and/or operator of the health of the electrical cable in the downhole environment. It should be understood that while embodiment and examples of systems or methods including time domain reflectometry are described herein, other measurements by reflectometry are contemplated, such as frequency domain reflectometry.

FIG. 3 is a flowchart illustrating an embodiment of a method 336 of measuring temperature in downhole environment. In some embodiments, the method 336 includes conveying an electrical cable in a downhole environment at 338. As described in relation to FIG. 1, the electrical cable may be conveyed downhole from a surface derrick or other surface system. The electrical cable may be conveyed on a wireline system, a coiled tubing system, or other mechanism for conveyance of line and/or tools downhole. In some embodiments, the wellbore is a vertical wellbore. In some embodiments, the wellbore is non-vertical or directional wellbore. In such systems, the electrical cable may be a communication cable, and it may be beneficial to measure a health of the cable during operations. In some embodiments, the temperature of the wellbore may affect the operations in the wellbore and measurement of the temperature may be desirable.

The method 336 further includes measuring a distributed electrical resistance of the electrical cable at 340. The distributed electrical resistance is, in some embodiments, measured by time domain reflectometry using a TDR. For example, the distributed electrical resistance is the electrical resistance of the electrical cable along a length of the electrical cable, where the electrical resistance varies along the length. In some embodiments, based on the time elapsed between the input pulse and the reflected pulse, a location associated with the reflected pulse is measured. In some embodiments, based on the height of the pulse and/or the rise time of the reflected pulse, the magnitude of the change in resistivity and/or rate of change in the resistivity is measured.

In some embodiments, the method 336 includes selecting a first point of the electrical cable at 342. For example, the TDR may measure the distributed electrical resistance in the electrical cable located in the downhole environment periodically or substantially continuously. Selecting a first point of the electrical cable includes selecting a position along the length of the cable and/or in the downhole environment that corresponds to a position along the length of the cable.

Based on a first electrical resistance at the first point and a known initial electrical resistance, the method 336 further includes determining a first cable temperature of the electrical cable at the first point at 344. In some embodiments, the resistivity of the electrical cable and/or the material of the cable is known for different temperatures. Therefore, the method includes determining the cable temperature of the electrical cable at the first point. The temperature of the cable at the first point is understood to be similar to or the same as the temperature in the wellbore at the first point, as well.

In some embodiments, the TDR may have a lower resolution in the electrical cable than a measurement in an optical cable. However, optical cable TDR requires stopping of downhole operations in a wireline or coiled tubing application, as the optical signals cannot be passed through the collector on the coiled tubing reel (such as that described in relation to FIG. 1). As the electrical signals can pass through the collector, the electrical TDR measurements can be performed during downhole operations. In some embodiments, a hybrid cable including both electrical cable and an optical line allows for periodic calibration of the electrical TDR measurements by using the optical TDR.

Figure 4:
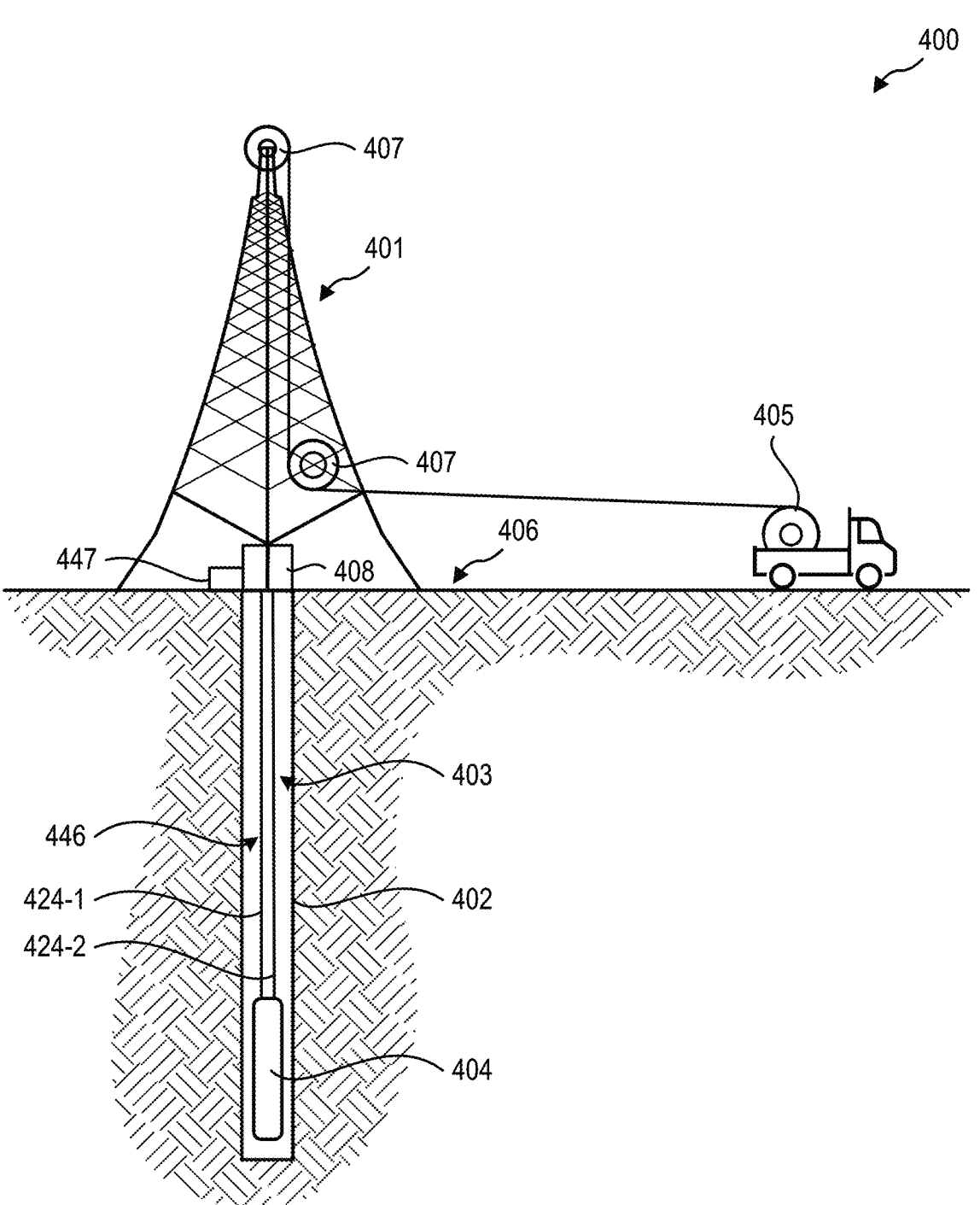
FIG. 4 is a system diagram of a conveyance system configured to convey a conveyance line including a hybrid cable for performing a conveyance operation within a wellbore, according to at least one embodiment of the present disclosure.

FIG. 4 is a system diagram of a conveyance system 400 configured to convey a conveyance line 403 including a hybrid cable 446 for performing a conveyance operation within a wellbore 402. The conveyance system 400 includes a rig, mast, or derrick 401 used to support a conveyance line 403 (e.g., WL line or CT line including a hybrid cable) at a surface 406. The conveyance line 403 may be suspended, inserted into, or otherwise positioned within the wellbore 402. For instance, the conveyance line 403 may pass through a wellhead 408. The wellhead 408 may provide a structural, pressure, and/or fluid barrier between the wellbore and the surface 406. For instance, the wellhead 408 may contain wellbore fluids within the wellbore 402. In some embodiments, surface equipment of the conveyance system 400 includes an injector head for conveying the conveyance line 403 within the wellbore. For example, an injector head may include one or more (e.g., hydraulic) drives, chain assemblies, grip assemblies, or other components for providing a tractive effort for running and/or retrieving the conveyance line 403 into and/or from the wellbore 402.

The wellbore 402 may extend through a subsurface and may traverse various formations, layers, strata, or other subterranean features. The wellbore 402 may be a completed (e.g., fully drilled or fully formed) wellbore, or may be a wellbore at any intermediate stage of completion and/or drilling. The wellbore 402 is depicted as extending substantially straight or vertical into the ground, however, the wellbore 402 may be formed in accordance with any trajectory. For example, the wellbore 402 can include one or more bends, doglegs, inclinations, etc., such that the wellbore 402 may exhibit any level of deviation or tortuosity, including in 3-dimensional space.

In some embodiments, the conveyance line 403 is connected to a downhole tool 404 for supporting or positioning the downhole tool 404 in the wellbore 402. The downhole tool 404 may be a logging tool, a completion tool, a production tool, or any other tool used for performing any downhole operation, such as for imaging or otherwise measuring characteristics of the wellbore 402 or subsurface, performing a perforation, setting a plug, retrieving lost or stuck equipment, isolating wellbore sections, testing wellbore integrity, sampling fluids, wellbore cleaning, wellbore repair, opening or closing valves, stimulation (e.g., fracking), circulating fluid, downhole communication, or any other tool for performing any other downhole function.

The conveyance line 403 is contained on a spool, reel, or drum 405 which is typically mounted to a truck, trailer, skid, or other equipment. The conveyance line 403 and the downhole tool 404 are advanced into and out of the wellbore 402 from the drum 405 through a series of pulleys, sheaves, motors, and drives. For example, the derrick 401 may include one or more sheaves 407 for directing the conveyance line 403 from the drum into the wellbore 402. The derrick 401 may represent an integration of the conveyance system 400 with an existing drill rig (e.g., used for forming the wellbore) or may be implemented as a separate derrick, mast, rig or other surface equipment constructed for administering the conveyance line 403 into the wellbore.

The conveyance line 403, the downhole tool 404, and other components of the conveyance system 400 may be subject to various forces, loads, and other dynamics. These various components have failure limits and other operational thresholds at which the components may break, yield, or otherwise fail. In at least some embodiments, the conveyance system 400 is controlled to limit strain on the conveyance line 403 to below a failure point.

In such embodiments, precise and accurate measurements of the temperature, strain, shock, vibration, etc. to which the conveyance line 403 and/or downhole tool 404 are exposed may be beneficial. Optical cables allow for more precise and more accurate reflectometry measurements. However, optical cables are more expensive and require operations to be halted, as described herein. For example, the hybrid cable 446 includes a first transmissive medium 424-1, such as an electrical cable, and a second transmissive medium 424-2 in communication (electrical communication, optical communication, etc.) with a TDR 447. While transmissive media that transmit different types of signals (i.e., electrical and optical) are described herein, it should be understood that transmissive media that transmit the same type of signals with different resolution, precision, or accuracy may be used. For example, the first transmissive medium 424-1 and the second transmissive medium 424-2 may both transmit electrical signals but include different electrically conductive materials.

FIG. 5 is a flowchart illustrating a method 548 of measuring a downhole property using a hybrid cable, according to at least some embodiments of the present disclosure. In some embodiments, the method 548 includes conveying an electrical cable in a downhole environment at 538. As described in relation to FIG. 1, the electrical cable may be conveyed downhole from a surface derrick or other surface system. The electrical cable may be conveyed on a wireline system, a coiled tubing system, or other mechanism for conveyance of line and/or tools downhole. In some embodiments, the wellbore is a vertical wellbore. In some embodiments, the wellbore is non-vertical or directional wellbore. It such systems, the electrical cable may be a communication cable, and it may be beneficial to measure a health of the cable during operations. In some embodiments, the temperature of the wellbore may affect the operations in the wellbore and measurement of the temperature may be desirable.

The method 548 further includes measuring a distributed electrical resistance of the electrical cable at 540. The distributed electrical resistance is, in some embodiments, measured by time domain reflectometry using a TDR. For example, the distributed electrical resistance is the electrical resistance of the electrical cable along a length of the electrical cable, where the electrical resistance varies along the length. In some embodiments, based on the time elapsed between the input pulse and the reflected pulse, a location associated with the reflected pulse is measured. In some embodiments, based on the height of the pulse and/or the rise time of the reflected pulse, the magnitude of the change in resistivity and/or rate of change in the resistivity is measured.

In some embodiments, the method 548 includes selecting a first point of the electrical cable at 542. For example, the TDR may measure the distributed electrical resistance in the electrical cable located in the downhole environment periodically or substantially continuously. Selecting a first point of the electrical cable includes selecting a position along the length of the cable and/or in the downhole environment that corresponds to a position along the length of the cable.

Based on a first electrical resistance at the first point and a known initial electrical resistance, the method 548 further includes determining a first cable temperature of the electrical cable at the first point at 544. In some embodiments, the resistivity of the electrical cable and/or the material of the cable is known for different temperatures. Therefore, the method includes determining the cable temperature of the electrical cable at the first point. The temperature of the cable at the first point is understood to be similar to or the same as the temperature in the wellbore at the first point, as well. In some situations, the temperature measurements and/or resistivity measurements of the electrical TDR can drift.

In some embodiments, the method 548 further includes selecting a second point of the electrical cable at 550 and measuring an optical temperature proximate to the second point at 552. In some embodiments, measuring the optical temperature includes measuring an optical TDR response of the optical line of the hybrid cable. The optical TDR is measured during a stoppage in operations, as described herein.

Using the distributed electrical resistance of the electrical cable, based on a second electrical resistance at the second point and the known initial electrical resistance, the method 548 includes determining a second cable temperature of the electrical cable at the second point at 553. In some embodiments, the second cable temperature is determined in the same or a similar manner to the first cable temperature.

The method 548 further includes determining a temperature offset based on the optical temperature and the second cable temperature at 554. For example, the temperature offset may be determined by calculating a difference between the optical temperature and the second cable temperature. The method 548 includes adjusting the first cable temperature based on the temperature offset at 556.

Figure 6:
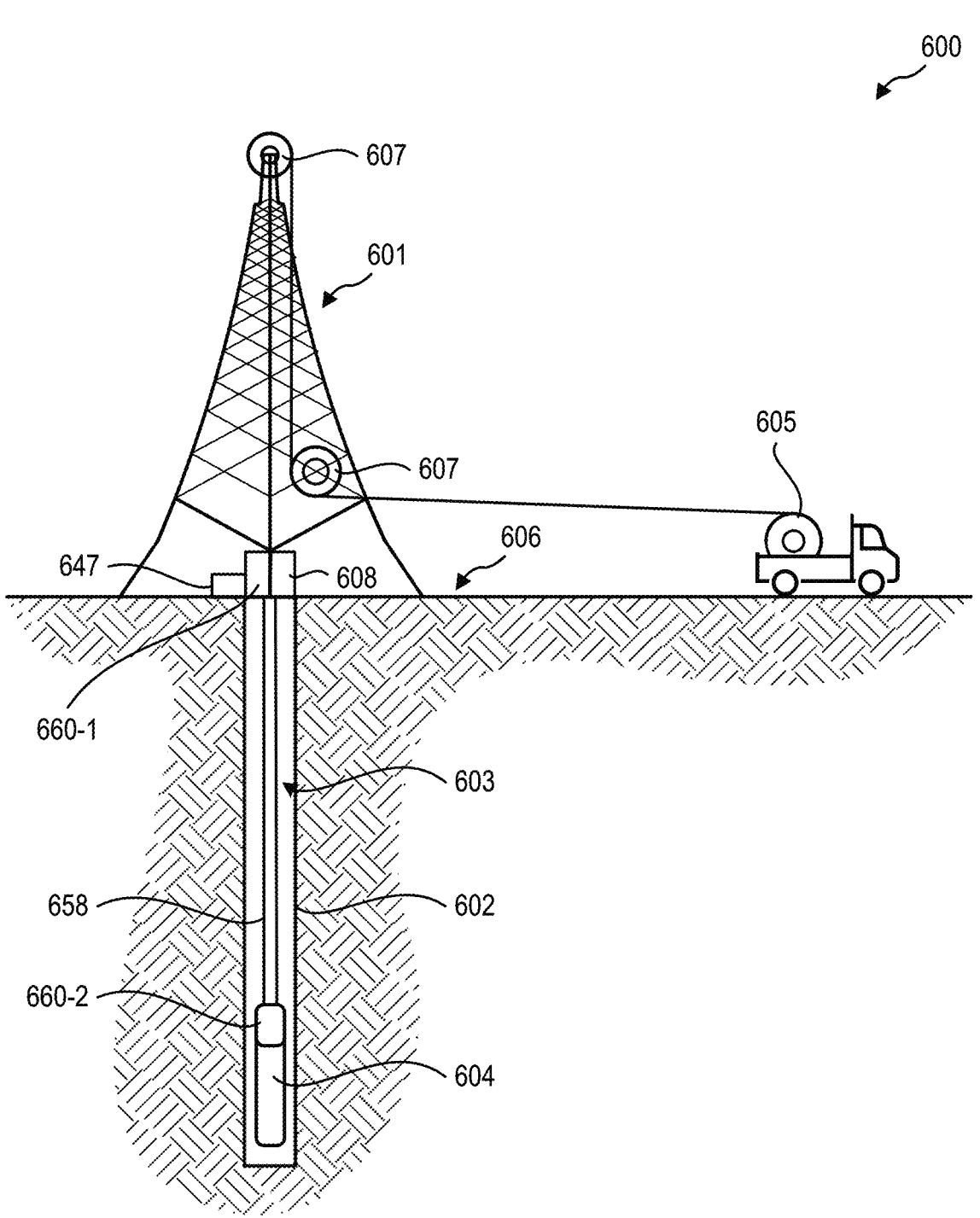
FIG. 6 is a system diagram of a conveyance system configured to convey a conveyance line including only an electrical cable (for TDR measurements) for performing a conveyance operation within a wellbore, according to at least one embodiment of the present disclosure.

FIG. 6 is a system diagram of a conveyance system 600 configured to convey a conveyance line 603 including only an electrical cable 658 (for TDR measurements) for performing a conveyance operation within a wellbore 602. The conveyance system 600 includes a rig, mast, or derrick 601 used to support a conveyance line 603 (e.g., WL line or CT line including a hybrid cable) at a surface 606. The conveyance line 603 may be suspended, inserted into, or otherwise positioned within the wellbore 602. For instance, the conveyance line 603 may pass through a wellhead 608. The wellhead 608 may provide a structural, pressure, and/or fluid barrier between the wellbore and the surface 606. For instance, the wellhead 608 may contain wellbore fluids within the wellbore 602. In some embodiments, surface equipment of the conveyance system 600 includes an injector head for conveying the conveyance line 603 within the wellbore. For example, an injector head may include one or more (e.g., hydraulic) drives, chain assemblies, grip assemblies, or other components for providing a tractive effort for running and/or retrieving the conveyance line 603 into and/or from the wellbore 602.

The wellbore 602 may extend through a subsurface and may traverse various formations, layers, strata, or other subterranean features. The wellbore 602 may be a completed (e.g., fully drilled or fully formed) wellbore, or may be a wellbore at any intermediate stage of completion and/or drilling. The wellbore 602 is depicted as extending substantially straight or vertical into the ground, however, the wellbore 602 may be formed in accordance with any trajectory. For example, the wellbore 602 can include one or more bends, doglegs, inclinations, etc., such that the wellbore 602 may exhibit any level of deviation or tortuosity, including in 3-dimensional space.

In some embodiments, the conveyance line 603 is connected to a downhole tool 604 for supporting or positioning the downhole tool 604 in the wellbore 602. The downhole tool 604 may be a logging tool, a completion tool, a production tool, or any other tool used for performing any downhole operation, such as for imaging or otherwise measuring characteristics of the wellbore 602 or subsurface, performing a perforation, setting a plug, retrieving lost or stuck equipment, isolating wellbore sections, testing wellbore integrity, sampling fluids, wellbore cleaning, wellbore repair, opening or closing valves, stimulation (e.g., fracking), circulating fluid, downhole communication, or any other tool for performing any other downhole function.

The conveyance line 603 is contained on a spool, reel, or drum 605 which is typically mounted to a truck, trailer, skid, or other equipment. The conveyance line 603 and the downhole tool 604 are advanced into and out of the wellbore 602 from the drum 405 through a series of pulleys, sheaves, motors, and drives. For example, the derrick 601 may include one or more sheaves 607 for directing the conveyance line 603 from the drum into the wellbore 602. The derrick 601 may represent an integration of the conveyance system 600 with an existing drill rig (e.g., used for forming the wellbore) or may be implemented as a separate derrick, mast, rig or other surface equipment constructed for administering the conveyance line 603 into the wellbore.

The conveyance line 603, the downhole tool 604, and other components of the conveyance system 600 may be subject to various forces, loads, and other dynamics. These various components have failure limits and other operational thresholds at which the components may break, yield, or otherwise fail. In at least some embodiments, the conveyance system 600 is controlled to limit strain on the conveyance line 603 to below a failure point.

In some embodiments, the TDR measurements of the electrical cable 658 are calibrated by comparing the temperature measurements of the TDR 647 against other temperature sensors 660-1, 660-2. For example, a first temperature sensor 660-1 may be located at a surface location proximate to the electrical cable 658. In such embodiments, the TDR 647 may measure a distributed electrical resistance of the electrical cable 658, and the determined cable temperature at a top hole location (e.g., the surface location) of the electrical cable 658 may be compared against the temperature measurement of the first temperature sensor 660-1 to determine an temperature offset or otherwise calibrate the TDR measurements of the cable temperatures. In some embodiments, a second temperature sensor 660-2 may be located at a downhole tool 604 proximate to the downhole end of the electrical cable 658. In such embodiments, the TDR 647 may measure a distributed electrical resistance of the electrical cable 658, and the determined cable temperature at a bottomhole location (e.g., proximate to the downhole tool 604 location) of the electrical cable 658 may be compared against the temperature measurement of the second temperature sensor 660-2 to determine an temperature offset or otherwise calibrate the TDR measurements of the cable temperatures. In some embodiments, both a first temperature sensor 660-1 and a second temperature sensor 660-2 are used to calibrate the TDR measurements of the cable temperatures. While the first temperature sensor 660-1 is described herein as a top hole measurement and a second temperature sensor 660-2 is described herein as a bottomhole measurement, other positions along the length of the electrical cable 658 and/or conveyance line 603 are contemplated.

Figure 7:
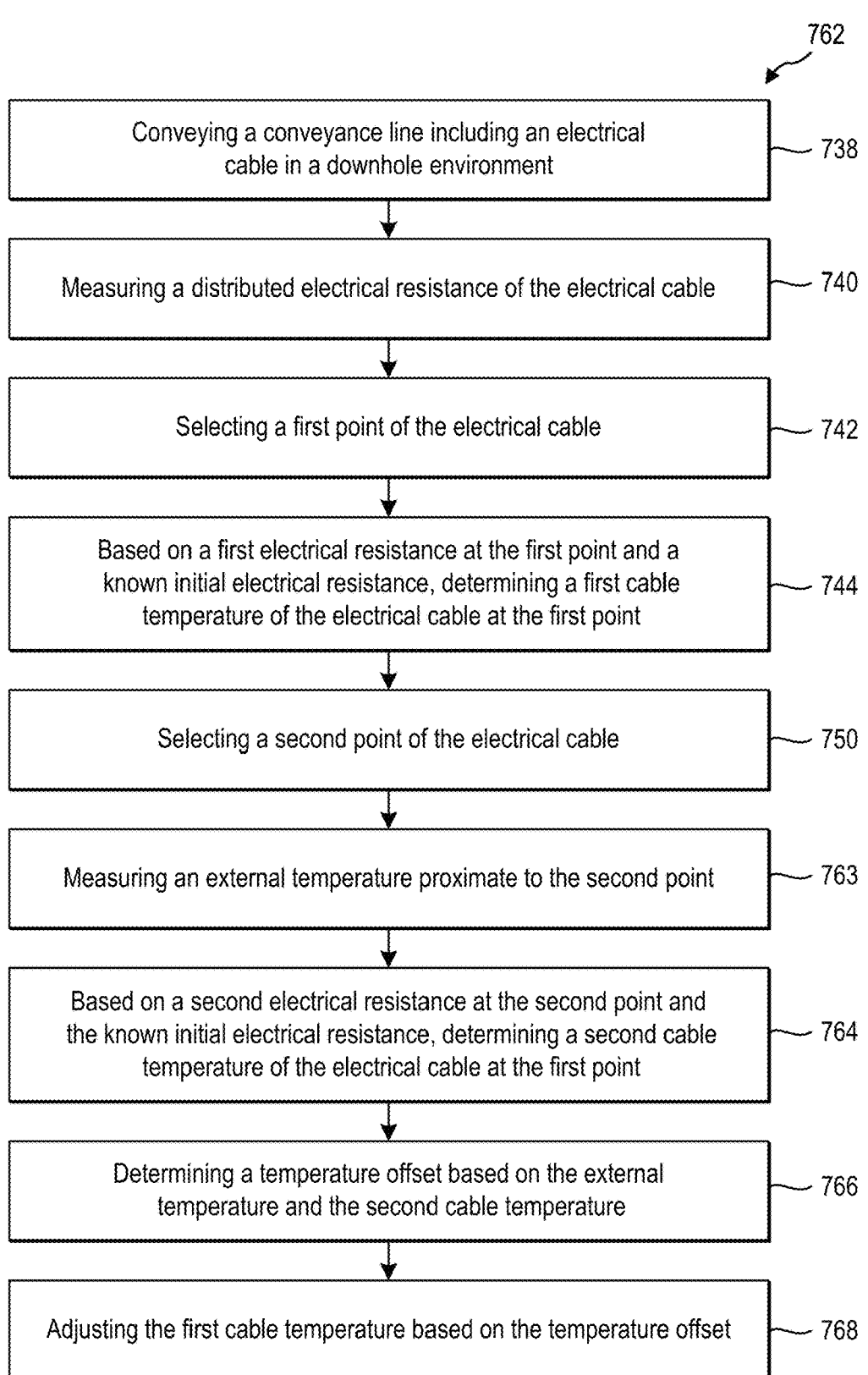
FIG. 7 is a flowchart illustrating a method of measuring a downhole property using a calibrated electrical cable, according to at least some embodiments of the present disclosure.

FIG. 7 is a flowchart illustrating a method 762 of measuring a downhole property using a calibrated electrical cable, according to at least some embodiments of the present disclosure. In some embodiments, the method 762 includes conveying an electrical cable in a downhole environment at 738. As described in relation to FIG. 1, the electrical cable may be conveyed downhole from a surface derrick or other surface system. The electrical cable may be conveyed on a wireline system, a coiled tubing system, or other mechanism for conveyance of line and/or tools downhole. In some embodiments, the wellbore is a vertical wellbore. In some embodiments, the wellbore is non-vertical or directional wellbore. It such systems, the electrical cable may be a communication cable, and it may be beneficial to measure a health of the cable during operations. In some embodiments, the temperature of the wellbore may affect the operations in the wellbore and measurement of the temperature may be desirable.

The method 762 further includes measuring a distributed electrical resistance of the electrical cable at 740. The distributed electrical resistance is, in some embodiments, measured by time domain reflectometry using a TDR. For example, the distributed electrical resistance is the electrical resistance of the electrical cable along a length of the electrical cable, where the electrical resistance varies along the length. In some embodiments, based on the time elapsed between the input pulse and the reflected pulse, a location associated with the reflected pulse is measured. In some embodiments, based on the height of the pulse and/or the rise time of the reflected pulse, the magnitude of the change in resistivity and/or rate of change in the resistivity is measured.

In some embodiments, the method 762 includes selecting a first point of the electrical cable at 742. For example, the TDR may measure the distributed electrical resistance in the electrical cable located in the downhole environment periodically or substantially continuously. Selecting a first point of the electrical cable includes selecting a position along the length of the cable and/or in the downhole environment that corresponds to a position along the length of the cable.

Based on a first electrical resistance at the first point and a known initial electrical resistance, the method 762 further includes determining a first cable temperature of the electrical cable at the first point at 744. In some embodiments, the resistivity of the electrical cable and/or the material of the cable is known for different temperatures. Therefore, the method includes determining the cable temperature of the electrical cable at the first point. The temperature of the cable at the first point is understood to be similar to or the same as the temperature in the wellbore at the first point, as well. In some situations, the temperature measurements and/or resistivity measurements of the electrical TDR can drift.

In some embodiments, the method 762 further includes selecting a second point of the electrical cable at 750 and measuring an external temperature proximate to the second point at 763. In some embodiments, measuring the external temperature includes measuring a temperature using a temperature sensor proximate to the second point on the electrical cable. As described in relation to FIG. 6, in some embodiments, the second point is a top hole location, and the external temperature is a temperature at the surface. In some embodiments, the second point is a bottomhole location, and the external temperature is measured with a temperature sensor in the downhole tool or other component at the downhole end of the conveyance line and/or electrical cable.

Using the distributed electrical resistance of the electrical cable, based on a second electrical resistance at the second point and the known initial electrical resistance, the method 762 includes determining a second cable temperature of the electrical cable at the second point at 764. In some embodiments, the second cable temperature is determined in the same or a similar manner to the first cable temperature.

The method 762 further includes determining a temperature offset based on the external temperature and the second cable temperature at 766. For example, the temperature offset may be determined by calculating a difference between the optical temperature and the second cable temperature. The method 762 includes adjusting the first cable temperature based on the temperature offset at 768.

Figure 8:
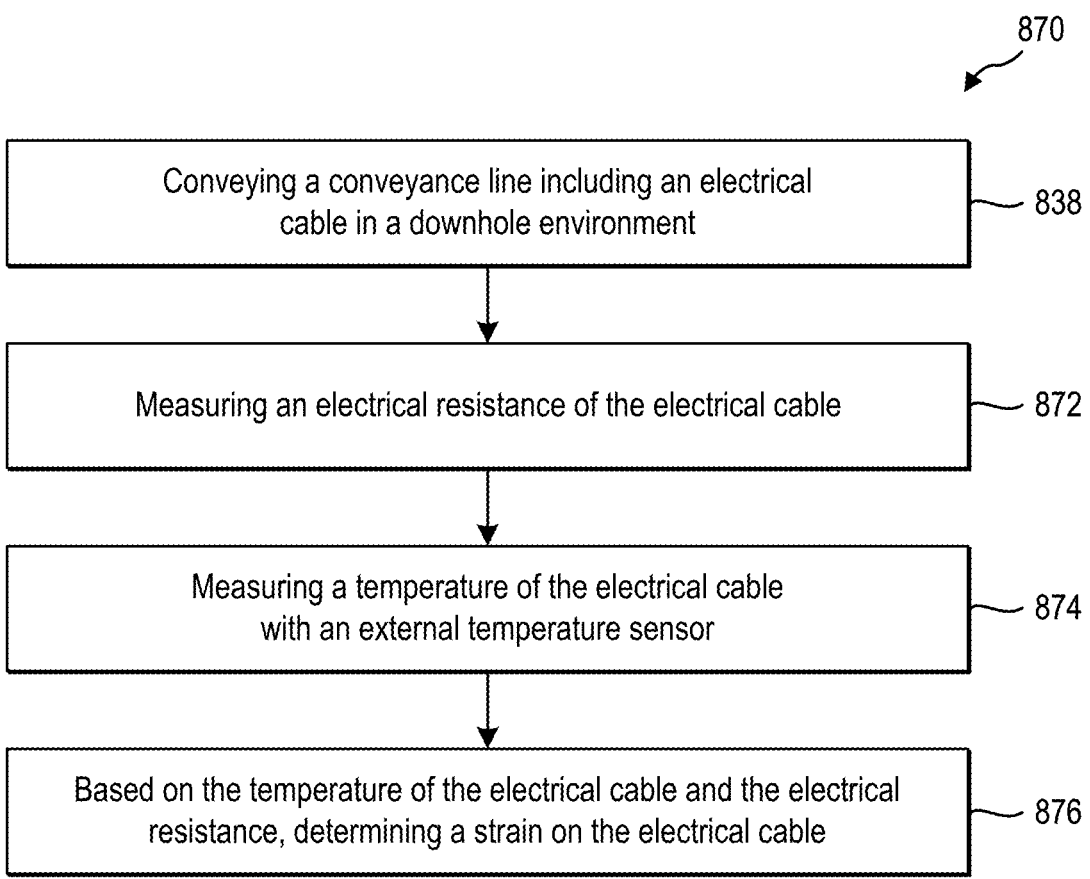
FIG. 8 is a flowchart illustrating a method of measuring health of an electrical cable on a conveyance line, according to at least one embodiment of the present disclosure.

FIG. 8 is a flowchart illustrating an embodiment of a method 870 of measuring health of an electrical cable on a conveyance line. In some embodiments, the distributed electrical resistivity of the electrical cable changes with strain applied thereto. For example, a resistivity of the electrical cable may be measured at a local with a known temperature (such as by an external temperature sensor or by another temperature measurement methodology), and the measured electrical resistivity with the TDR may exhibit a difference from an expected electrical resistivity of the electrical cable based on the known temperature. In such examples (and because the electrical TDR measurements can be collected during operations), the distributed electrical resistivity measurements can indicate strain on the electrical cable in the downhole environment.

In some embodiments, the method 870 includes conveying an electrical cable in a downhole environment at 838. As described in relation to FIG. 1, the electrical cable may be conveyed downhole from a surface derrick or other surface system. The electrical cable may be conveyed on a wireline system, a coiled tubing system, or other mechanism for conveyance of line and/or tools downhole. In some embodiments, the wellbore is a vertical wellbore. In some embodiments, the wellbore is non-vertical or directional wellbore. It such systems, the electrical cable may be a communication cable, and it may be beneficial to measure a health of the cable during operations. In some embodiments, the temperature of the wellbore may affect the operations in the wellbore and measurement of the temperature may be desirable.

The method 870 further includes measuring an electrical resistance of the electrical cable at 872. In some embodiments, measuring an electrical resistance of the electrical cable includes measuring a distributed electrical resistance. For example, the distributed electrical resistance may be measured by time domain reflectometry using a TDR. For example, the distributed electrical resistance is the electrical resistance of the electrical cable along a length of the electrical cable, where the electrical resistance varies along the length. In some embodiments, based on the time elapsed between the input pulse and the reflected pulse, a location associated with the reflected pulse is measured. In some embodiments, based on the height of the pulse and/or the rise time of the reflected pulse, the magnitude of the change in resistivity and/or rate of change in the resistivity is measured.

In some embodiments, the method 870 further includes measuring a temperature of the electrical cable with an external temperature sensor at 874. For example, the temperature measurement may be collected by a temperature sensor in a bottomhole location, a top hole location, or a plurality of locations in the wellbore.

Based on the measured temperature and the known initial resistance, the method 870 further includes determining a strain on the electrical cable at 876. For example, the resistance of the electrical cable may increase exponentially with strain. In such an example, any change in resistance due to temperature may be compensated for when calculating the strain exhibited as the remaining increase in resistance.

In some embodiments, the method 870 optionally includes selecting a first point of the electrical cable and measuring a first temperature of the first point with an external temperature sensor. Selecting a first point of the electrical cable includes selecting a position along the length of the cable and/or in the downhole environment that corresponds to a position along the length of the cable. In some embodiments, measuring the first temperature includes calculating the first temperature from one or more temperature measurements from other locations in the wellbore. For example, temperature may increase linearly in the wellbore as depth increases, and a first temperature at the first point may be calculated by extrapolating a measured temperature at a bottomhole location and a top hole location based on the location of the first point therebetween.

In some embodiments, based on the known temperature at the first point, the known initial resistance, and the distributed electrical resistance, the method 870 further includes determining a strain on the electrical cable at the first point.

The embodiments of the measurement methods and systems have been primarily described with reference to wellbore operations; the methods and systems described herein may be used in applications other than the those of a wellbore. In other embodiments, the methods and systems according to the present disclosure may be used outside a wellbore or other downhole environment used for the exploration or production of natural resources. For instance, the methods and systems of the present disclosure may be used in a borehole used for placement of utility lines. Accordingly, the terms "wellbore," "borehole" and the like should not be interpreted to limit tools, systems, assemblies, or methods of the present disclosure to any particular industry, field, or environment.

Embodiments of the present disclosure relate to systems and methods for measuring a condition of a conveyance system in a downhole environment according to at least the following clauses:

Clause 1. A method of measuring temperature in a downhole environment, the method comprising: conveying a conveyance line including an electrical cable in a downhole environment; measuring a distributed electrical resistance of the electrical cable; selecting a first point of the electrical cable; and based on a first electrical resistance at the first point and a known initial electrical resistance, determining a first cable temperature of the electrical cable at the first point.

Clause 2. The method of clause 1, wherein measuring the distributed electrical resistance includes using time domain reflectometry.

Clause 3. The method of clause 1, wherein measuring the distributed electrical resistance includes using frequency domain reflectometry.

Clause 4. The method of clause 1, wherein measuring a distributed electrical resistance of the electrical cable is performed without stopping operations in the downhole environment.

Clause 5. The method of clause 1, wherein the electrical cable is a portion of a hybrid cable including an optical line.

Clause 6. The method of clause 5, further comprising: selecting a second point of the electrical cable; measuring an optical temperature proximate to the second point; based on a second electrical resistance at the second point and the known initial electrical resistance, determining a second cable temperature of the electrical cable at the first point; determining a temperature offset based on the optical temperature and the second cable temperature; and adjusting the first cable temperature based the temperature offset.

Clause 7. The method of clause 1, further comprising: selecting a second point of the electrical cable; measuring an external temperature proximate to the second point; based on a second electrical resistance at the second point and the known initial electrical resistance, determining a second cable temperature of the electrical cable at the second point; determining a temperature offset based on the external temperature and the second cable temperature; and adjusting the first cable temperature based on the temperature offset.

Clause 8. The method of clause 7, wherein the second point of the electrical cable is a surface location of the electrical cable.

Clause 9. The method of clause 7, wherein the second point of the electrical cable is a downhole end of the electrical cable.

Clause 10. The method of clause 1, wherein the conveyance line is a coiled tubing line.

Clause 11. A method of conveying a downhole tool in a downhole environment, the method comprising: conveying an conveyance line including an electrical cable and coiled tube line in a downhole environment; measuring an electrical resistance of the electrical cable; measuring a temperature of the electrical cable; and based on the electrical resistance and a known initial electrical resistance, determining a strain applied to the electrical cable.

Clause 12. The method of clause 11, wherein measuring the electrical resistance of the electrical cable includes measuring a distributed electrical resistance of the electrical cable along a length of the electrical cable.

Clause 13. The method of clause 12, wherein measuring the distributed electrical resistance includes using time domain reflectometry.

Clause 14. The method of clause 12, wherein measuring the distributed electrical resistance includes using frequency domain reflectometry.

Clause 15. The method of clause 12, further comprising: selecting a first point of the electrical cable; and based on the distributed electrical resistance of the electrical cable at the first point, determining a strain applied to the first point of the electrical cable.

Clause 16. A system, comprising: a derrick; a conveyance line positioned within a wellbore and being conveyed from a drum, wherein the conveyance line includes an electrical cable; and a reflectometer in electrical communication with the electrical cable.

Clause 17. The system of clause 16, wherein the reflectometer is a time domain reflectometer (TDR).

Clause 18. The system of clause 16, wherein the electrical cable is a portion of a hybrid cable including an optical line.

Clause 19. The system of clause 16, wherein the conveyance line is a coiled tubing line.

Clause 20. The system of clause 16, further comprising a temperature sensor configured to measure a temperature of at least a portion of the conveyance line.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that is within standard manufacturing or process tolerances, or which still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements. Additionally, as used herein, the term "and/or" includes any and all combinations of one or more of the associated listed items.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A method of measuring temperature in a downhole environment, the method comprising:
   conveying a conveyance line including an electrical cable in the downhole environment;
   measuring a distributed electrical resistance of the electrical cable;
   selecting a first point of the electrical cable;
   based on a first electrical resistance at the first point and a known initial electrical resistance, determining a first cable temperature of the electrical cable at the first point;
   selecting a second point of the electrical cable;
   measuring an external temperature proximate to the second point;
   based on a second electrical resistance at the second point and the known initial electrical resistance, determining a second cable temperature of the electrical cable at the second point;
   determining a temperature offset based on the external temperature and the second cable temperature; and
   adjusting the first cable temperature based on the temperature offset.

2. The method of claim 1, wherein measuring the distributed electrical resistance includes using time domain reflectometry.

3. The method of claim 1, wherein measuring the distributed electrical resistance includes using frequency domain reflectometry.

4. The method of claim 1, wherein measuring the distributed electrical resistance of the electrical cable is performed without stopping operations in the downhole environment.

5. The method of claim 1, wherein the second point of the electrical cable is a surface location of the electrical cable.

6. The method of claim 1, wherein the second point of the electrical cable is a downhole end of the electrical cable.

7. The method of claim 1, wherein the conveyance line is a coiled tubing line.

8. A method of measuring temperature in a downhole environment, the method comprising:

conveying a conveyance line including an electrical cable in the downhole environment, wherein the electrical cable is a portion of a hybrid cable including an optical line;

measuring a distributed electrical resistance of the electrical cable;

selecting a first point of the electrical cable;

based on a first electrical resistance at the first point and a known initial electrical resistance, determining a first cable temperature of the electrical cable at the first point;

selecting a second point of the electrical cable;

measuring an optical temperature proximate to the second point;

based on a second electrical resistance at the second point and the known initial electrical resistance, determining a second cable temperature of the electrical cable at the first point;

determining a temperature offset based on the optical temperature and the second cable temperature; and adjusting the first cable temperature based on the temperature offset.

9. The method of claim 8, wherein measuring the distributed electrical resistance includes using time domain reflectometry.

10. The method of claim 8, wherein measuring the distributed electrical resistance includes using frequency domain reflectometry.

11. The method of claim 8, wherein the conveyance line is a coiled tubing line.

* * * * *